United States Patent
Shigemasa et al.

(10) Patent No.: US 6,981,179 B1
(45) Date of Patent: Dec. 27, 2005

(54) MICROCOMPUTER HAVING BUILT-IN NONVOLATILE MEMORY AND CHECK SYSTEM THEREOF AND IC CARD PACKING MICROCOMPUTER HAVING BUILT-IN NONVOLATILE MEMORY AND CHECK SYSTEM THEREOF

(75) Inventors: Haruhiko Shigemasa, Yamatokoriyama (JP); Kazuhiro Yaegawa, Yamatokoriyama (JP); Masaaki Tanno, Hadano (JP); Nobuhiro Shimoyama, Isehara (JP); Tadao Takeda, Ebina (JP)

(73) Assignees: Sharp Kabushiki Kaisha, Osaka (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/552,701

(22) Filed: Apr. 19, 2000

(30) Foreign Application Priority Data

Apr. 23, 1999 (JP) ................................. 11-117099

(51) Int. Cl.⁷ ............................................. G06F 11/00
(52) U.S. Cl. ............................. 714/36; 714/30; 714/31; 714/42; 713/2
(58) Field of Search ............................. 714/36, 30, 42, 714/31; 713/2

(56) References Cited

U.S. PATENT DOCUMENTS

| 4,729,124 A | * | 3/1988 | Hansel et al. ................. 714/31 |
| 5,029,168 A | * | 7/1991 | Chan ........................... 714/27 |
| 5,039,850 A | | 8/1991 | Yamaguchi |
| 5,159,183 A | * | 10/1992 | Yamaguchi ................. 235/492 |
| 5,200,600 A | * | 4/1993 | Shinagawa ................... 235/492 |
| 5,276,903 A | * | 1/1994 | Shinagawa ................... 712/37 |
| 5,818,848 A | * | 10/1998 | Lin et al. ..................... 714/718 |

FOREIGN PATENT DOCUMENTS

| DE | 4100151 | | 12/1991 | |
| EP | 328289 A2 | * | 8/1989 | ............. G07F 7/10 |
| JP | 56-121153 A | | 9/1981 | |
| JP | 60-3082 | | 1/1985 | |
| JP | 60-193056 | | 10/1985 | |
| JP | 61221837 | | 10/1986 | |
| JP | 63073339 | | 4/1988 | |
| JP | 64-47148 | | 3/1989 | |
| JP | 01223586 A | * | 9/1989 | .......... G06K 19/00 |
| JP | 02037484 A | * | 2/1990 | .......... G06K 19/73 |
| JP | 2-103640 | | 4/1990 | |
| JP | 9-44372 A | | 2/1997 | |
| JP | 10-171675 | | 6/1998 | |

* cited by examiner

*Primary Examiner*—Nadeem Iqbal
*Assistant Examiner*—Emerson Puente
(74) *Attorney, Agent, or Firm*—Birch, Stewart, Kolasch & Birch, LLP

(57) ABSTRACT

When a built-in nonvolatile memory in a microcomputer is tested, a control program prestored in a boot ROM is run upon entering a test command from an external communication device; a test program is transferred from the external communication device to a built-in RAM through a communication circuit; a control of a CPU is switched to the built-in RAM after the test program has been transferred and a test is conducted on the nonvolatile memory; and a test result and a fail log are transferred to the external communication device through the communication circuit. Consequently, the built-in nonvolatile memory in the microcomputer can be checked without leaving the test program on the chip.

20 Claims, 7 Drawing Sheets

F I G. 5
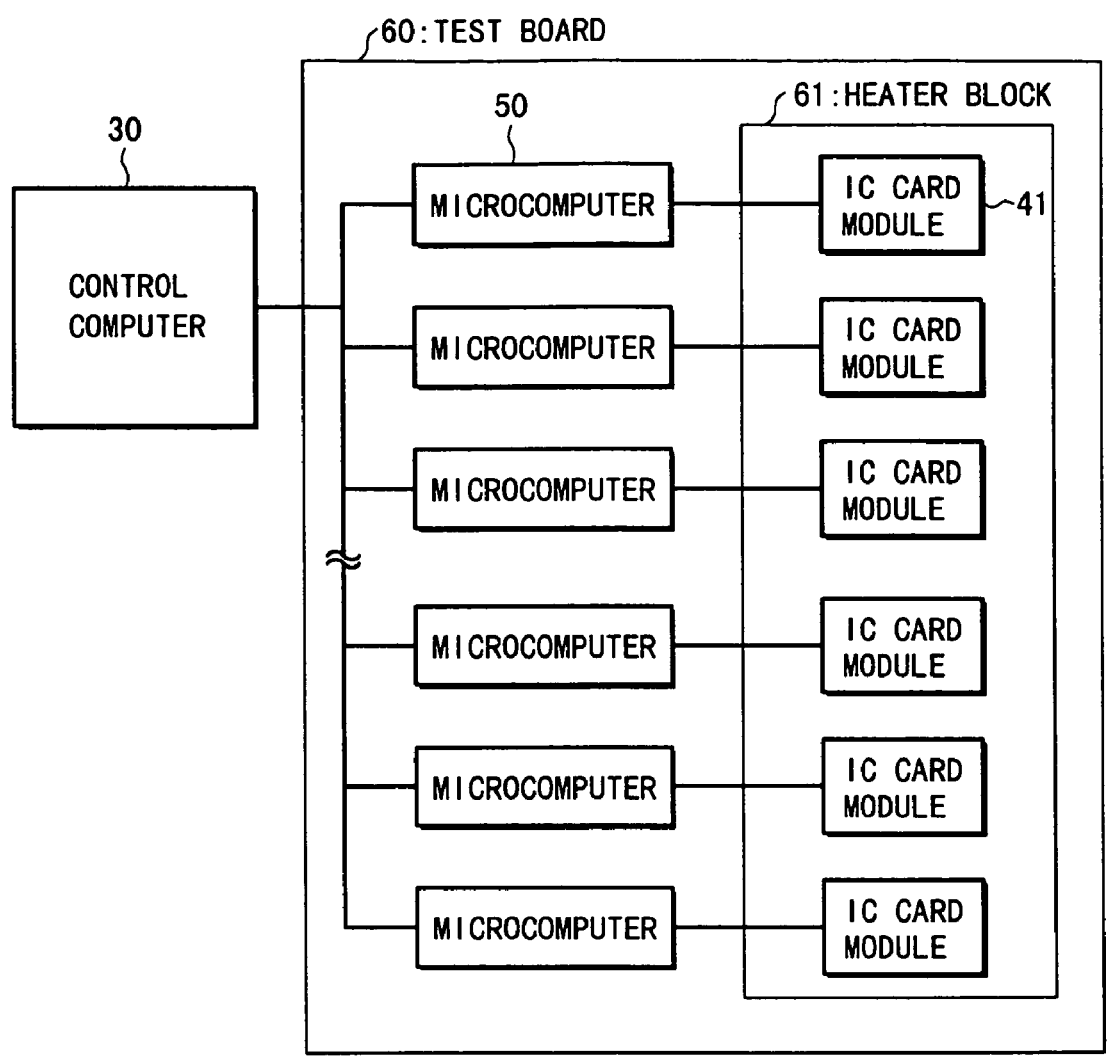

MICROCOMPUTER HAVING BUILT-IN NONVOLATILE MEMORY AND CHECK SYSTEM THEREOF AND IC CARD PACKING MICROCOMPUTER HAVING BUILT-IN NONVOLATILE MEMORY AND CHECK SYSTEM THEREOF

FIELD OF THE INVENTION

The present invention relates to a microcomputer having a built-in nonvolatile memory, an IC card packing the same, and a check system thereof.

BACKGROUND OF THE INVENTION

It is easy to overwrite data or programs written into an at least partially erasable built-in nonvolatile memory in a microcomputer by external means, such as general memory writer and tester, or internal means, such as internal CPU and ROM. For this reason, microcomputers having built-in nonvolatile memories are used extensively in electric appliances and OA (Office Automation) systems as data memories or program memories.

Further, a recent years' remarkable increase in a memory capacity provides a variety of uses for the microcomputers. Under these circumstances, there has been an increasing need for microcomputers which can assure safety of human health and ensure higher security. Accordingly, the need for higher reliability of a built-in non-volatile memory in the microcomputer as to the overwritable times, the validity of saved data, etc. has been also increasing.

In order to upgrade the reliability of the microcomputers having built-in nonvolatile memories, a more accurate test should be conducted on the nonvolatile memories per se, and more importantly, a test should be conducted on the microcomputers as the completed products and further on IC cards packing the same.

The following will explain a test conducted on a built-in nonvolatile memory in a conventional typical microcomputer with reference to FIGS. 6 and 7.

As shown in FIG. 6, a conventional typical microcomputer 80 comprises a nonvolatile memory 81, a RAM 82, a CPU 83, a control circuit 84, and a boot ROM 85, which are interconnected to each other via an internal bus.

In most of the cases, a general logic tester or the like is used to test the above-arranged microcomputer 80. More specifically, as shown in FIG. 7, a plurality of test terminals (terminal group 91) of a general logic tester 90 (hereinafter, referred to simply as tester 90) are connected to a plurality of test terminals (terminal group 86) of the microcomputer 80 in a one-to-one correspondence. Then, the microcomputer 80 is switched to the test mode by a signal from the tester 90, and a test is conducted on the internal circuits.

In this case, the test program is stored in the tester 90, and for this reason, in order to enable the tester 90 to give a data signal, an address signal, a clock signal, a control signal, etc. to the microcomputer 80, connecting means composed of at least tens of pins is necessary (FIG. 7).

Thus, this test method using the tester 90 can not be applied when conducting a final test on the memory section of the completed product prior to shipment. Hence, a final check can be conducted only by a so-called actual test, by which the completed product is actually operated for a check-up. In other words, after the microcomputer 80 is packed in the product, the check-up items available by the above test method are limited to writing, reading, and erasing with respect to the nonvolatile memory 81, and there is a problem that detailed check-up items, such as a shift quantity of a Vth voltage in each memory cell, can not be tested.

If the microcomputer 80 packed in the product could be connected to the tester 90 through connecting means composed of tens of pins, there arises another problem that the general tester can test only one chip at a time. The most advanced general logic tester can test more than one chip, but the number of chips is limited to a few at most. If the nonvolatile memory 81 is to be tested in detail with high accuracy, the time required for the test and the number of check-up items are increased markedly compared with the conventional test method. Thus, it is essential to test a greater number of chips simultaneously to save the cost of the test.

As has been discussed, one of the most important applications of the microcomputer having an at least partially erasable built-in nonvolatile memory is the use in an IC card.

The IC card is defined as a card including a information data recording memory represented by a nonvolatile memory, and a microcomputer which controls the memory, wherein data and programs are stored in the memory while data is read out or written into the memory when necessary. EEPROMs (Electrically Erasable and Programmable Read Only Memories) are well known as a built-in information data recording memory in the IC card. Typical EEPROMs have a memory capacity of 8–16 Kbytes and data can be overwritten up to 10,000 times. However, IC cards having built-in memories with a capacity increased to hundreds Kbytes to some Mbytes, such as a flash memory and a FERAM (Ferro Electric Random Access Memory), and ensuring tens to hundreds thousands times of overwriting have been nearing the practical use.

The IC cards are used in diversified fields including electronic settlements of accounts, public transportation, medical, distributions, etc. For this reason, not only higher reliability, but also higher security against forgery are required for the IC cards.

In order to ensure reliability of the IC card having a built-in nonvolatile memory, the test is generally conducted on the chip per se, and another test is conducted further on the memory packed in the card. A generally adopted test method for the memory is as follows. That is, a test program is stored in the built-in ROM or test ROM during the manufacturing process, so that when a test command is entered from an external check device, the CPU starts to run the test program on the test ROM, whereby the test is conducted on the memory.

For example, Japanese Laid-open Patent Application No. 3082/1985 (Japanese Official Gazette, Tokukaisho No. 60-3082, publishing date: Jan. 9, 1985) discloses a technique which realizes the test on the memory packed in the IC card. More specifically, an IC card is set in a certain check device and a test command signal is sent to the IC card from the check device, whereupon the CPU starts to run the test program prestored in the built-in ROM, thereby making it possible to conduct a test on the memory packed in the IC card.

Also, Japanese Laid-open Patent Application No. 193056/1985 (Japanese Official Gazette, Tokukaisho No. 60-193056, publishing date: Oct. 1, 1985) discloses a similar technique.

However, the above conventional technique essentially uses the test program written into the ROM, and therefore, the IC card has to additionally include the test ROM or secure a program area for the test program in the built-in ROM. Thus, because the capacity secured for the test program is limited, there is a problem that a test can not be conducted in a satisfactory manner to ensure the reliability of the memory.

The number of the tests conducted on the nonvolatile memory should be increased with the increasing reliability. In particular, in order to ensure tens to hundreds thousands times of overwriting, in addition to the test of writing/reading/erasing with respect to the memory, a test should be conducted on the writing/reading/erasing margins by checking the Vth voltage in each memory cell.

However, the test program written into the ROM can not be overwritten. Thus, if a plurality kinds of test programs need to be written into the ROM, a capacity of the ROM has to be increased markedly. Even if a capacity of the ROM is increased, however, the check device and chip communicate in a one-to-one correspondence in the final stage. Thus, unlike the burn-in test, a large number of chips can not be tested at a time.

Further, should the chip packed in the IC card be analyzed for forgery with the today's advanced analysis technique, in case that the program data is created and written into the ROM during the manufacturing process, highly confidential data, such as address information of the nonvolatile memory and Vth data, is readily analyzed by irradiating laser beams from the back surface of the wafer, etc. Hence, storing the test program for the nonvolatile memory in the ROM is virtually exposing the security of the IC card to danger.

This problem could be solved by replacing the ROM with another nonvolatile memory for storing the test program, and erasing the test program after the test is completed. However, by providing an additional nonvolatile memory for the use of test alone, not only the chip area is increased undesirably, but also another test should be conducted on this additional nonvolatile memory. This counter method is, therefore, not worthwhile after all.

SUMMARY OF THE INVENTION

It is therefore an object of the present invention to provide a microcomputer having a built-in nonvolatile memory which can realize a check-up without leaving a test program on the chip, an IC card packing the same, and a check system thereof.

In order to fulfill the above and other objects, a microcomputer having a built-in nonvolatile memory of the present invention is characterized by being furnished with:
 a communication circuit for receiving a test program for a nonvolatile memory from an external check system; and
 a RAM on which the test program is run.

According to the above arrangement, the test program for the nonvolatile memory is sent from the external check system through the communication circuit. The test program is run on the RAM, and the nonvolatile memory is tested in accordance with the test program.

Incidentally, in order to check the built-in nonvolatile memory in the microcomputer, the test program for the nonvolatile memory is conventionally stored in the built-in ROM or test ROM during the manufacturing process so as to cut the check time shorter and make the check system simpler.

However, the above conventional arrangement has a following problem. That is, the program written into the ROM can not be overwritten whereas a number of test programs should be written into the ROM but the ROM has a limited capacity. Hence, a sufficient number of programs can not be written into the ROM, thereby making it impossible to conduct a test in a satisfactory manner to prove high reliability of the nonvolatile memory.

Further, in case that the program data is created and written into the ROM during the manufacturing process, the data can be readily analyzed. Thus, the conventional method, that is, storing the test program in the ROM, is virtually exposing the security of the IC card to danger.

In contrast, according to the arrangement of the present invention, the test program for the nonvolatile memory is sent from the external check system and run on the RAM. Thus, a number of test programs can be transferred temporarily to the RAM and run thereon without using a ROM in which the test programs has been written in advance. Consequently, a highly reliable test having a sufficient number of check-up items can be conducted without any restriction from a limited capacity of the ROM.

Further, the test program transferred onto the RAM is erased as soon as the test is completed and the supply of the power source voltage is stopped. Thus, because the test program is not left in the completed product, unauthorized analysis of the test program can be prevented. The foregoing is particularly effective for a product that requires high reliability and security, such as the IC card packing the microcomputer having a nonvolatile memory.

Also, a check system of the present invention of the microcomputer having a built-in nonvolatile memory is characterized by being furnished with:
 at least one external communication device connected to the microcomputer in such a manner so as to allow a communication in a one-to-one correspondence,
 each external communication device including,
  a storage device having stored a test program for a built-in nonvolatile memory in the microcomputer, and
  a communication microcomputer for sending the test program to the microcomputer.

According to the above arrangement, the external communication device and the microcomputer having a built-in nonvolatile memory are connected to each other in such a manner so as to allow a communication in a one-to-one correspondence. The external communication device stores the test program for the built-in nonvolatile memory in the microcomputer, and sends the same to the microcomputer having a built-in nonvolatile memory.

In other words, it is not necessary to write the test program in the built-in ROM or test ROM in the microcomputer having a built-in nonvolatile memory in advance, because the test program can be sent from the external communication device. Consequently, a highly reliable test having a sufficient number of check-up items can be conducted without any restriction from a limited capacity of the ROM.

For a fuller understanding of the nature and advantages of the invention, reference should be made to the ensuing detailed description taken in conjunction with the accompanying drawings.

BRIEF DESCRIPTION OF THE DRAWINGS

FIG. 5 is a block diagram schematically showing a check system of an IC card module packing the DUT having a built-in nonvolatile memory of FIG. 4;

DESCRIPTION OF THE EMBODIMENTS

Embodiment 1

Figure 1:
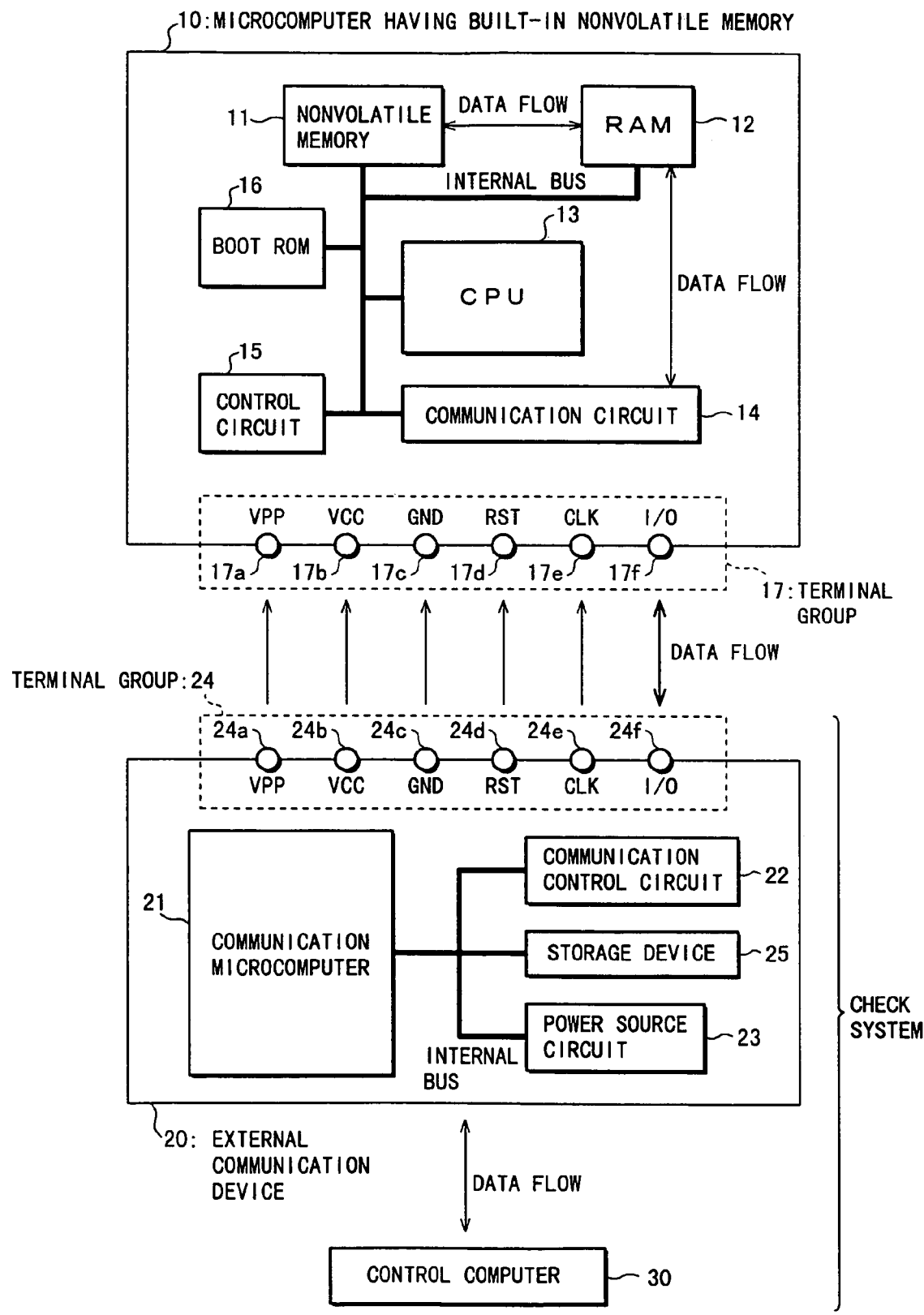
FIG. 1 is a block diagram schematically showing an arrangement of a microcomputer having a built-in nonvolatile memory and a check system thereof in accordance with one embodiment of the present invention.
Figure 2:
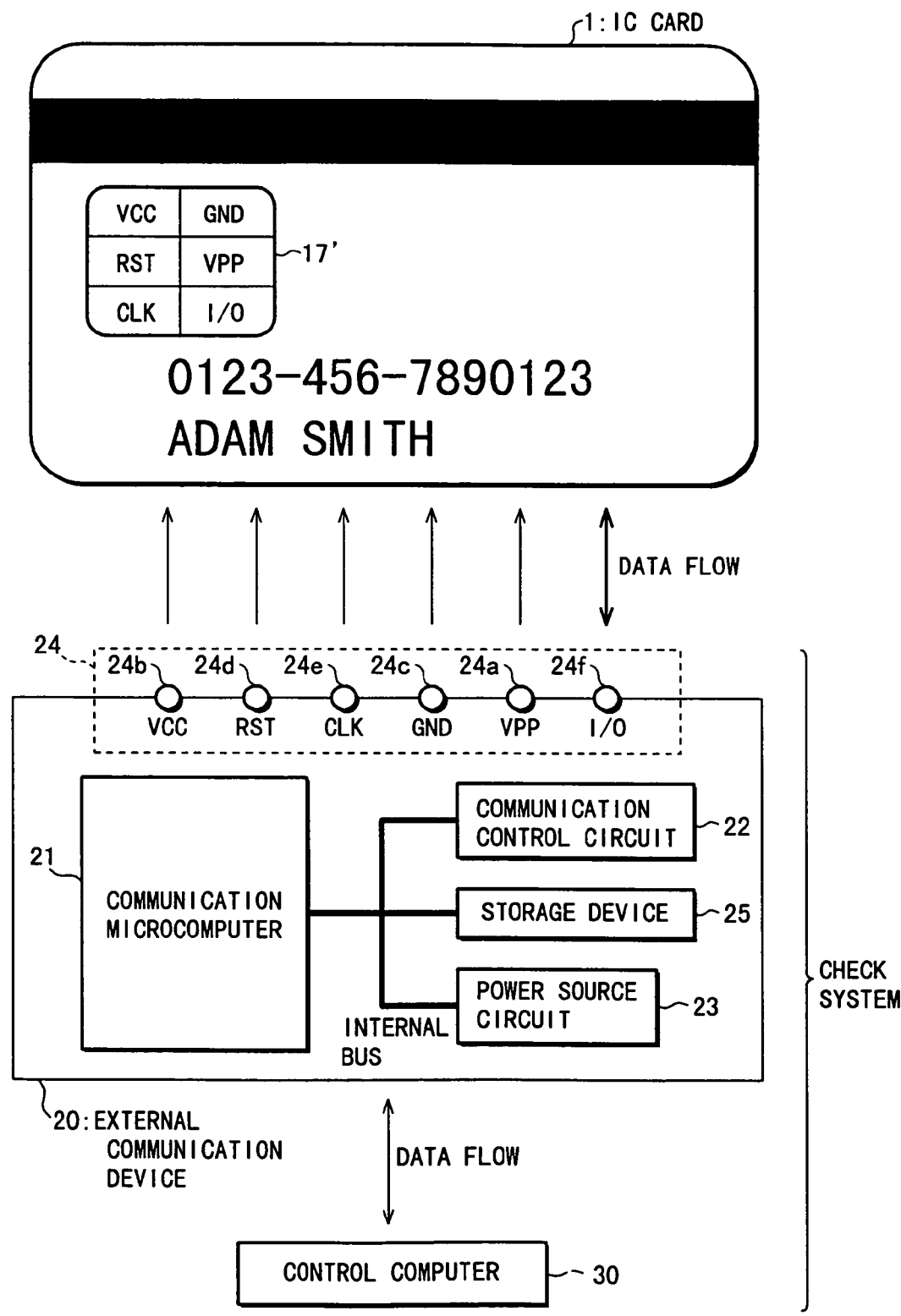
FIG. 2 is a block diagram schematically showing an arrangement of an IC card packing the microcomputer having a built-in nonvolatile memory of FIG. 1 and a check system thereof.
Figure 3:
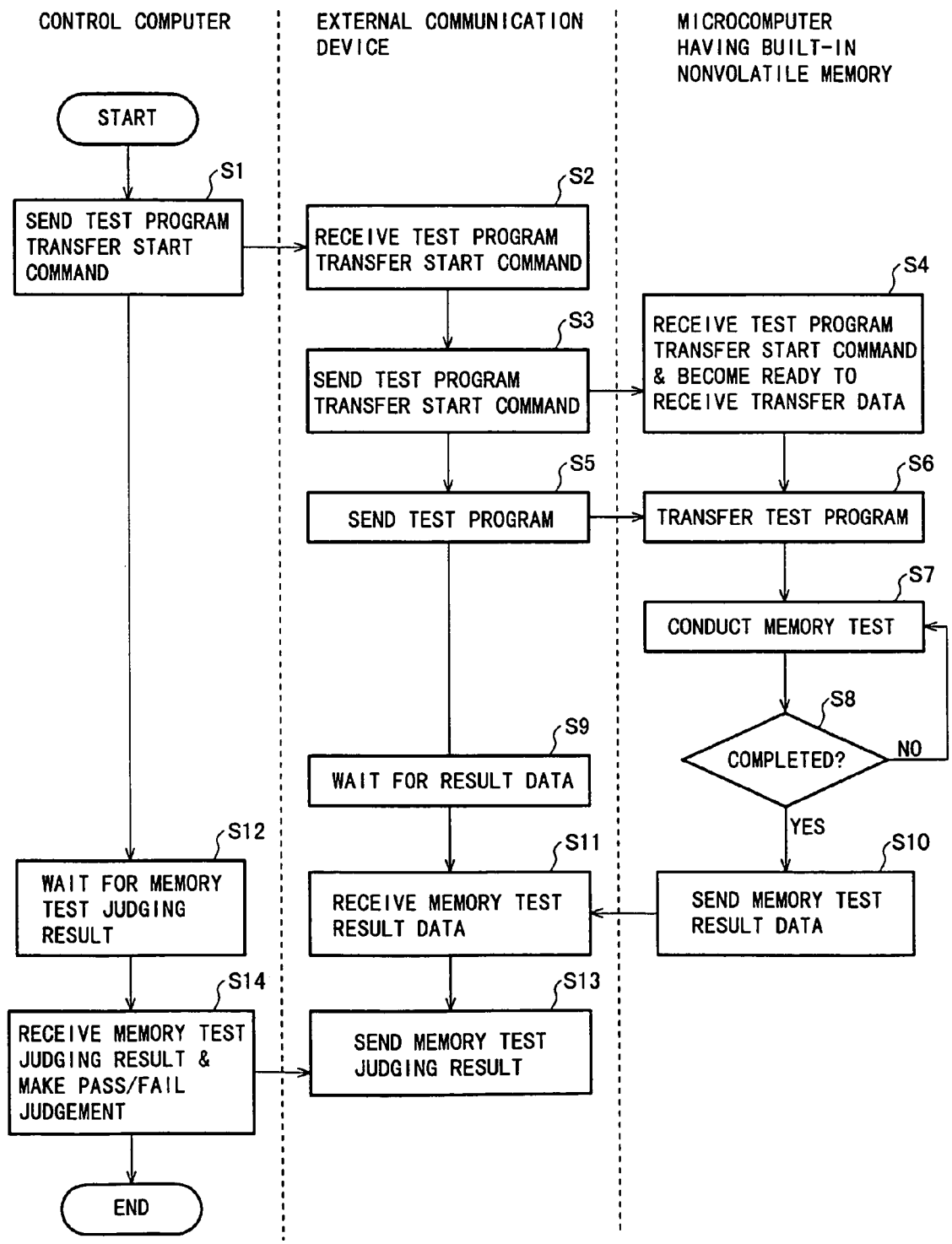
FIG. 3 is a flowchart detailing operations of the microcomputer having a built-in nonvolatile memory of FIG. 1 and a check system of a DUT of FIG. 4.

Referring to FIGS. 1 through 3, the following description will describe one embodiment of the present invention.

As shown in FIG. 1, a check system of a microcomputer 10 having a built-in nonvolatile memory of the present embodiment (hereinafter, referred to simply as microcomputer 10) comprises an external communication device 20 and a control computer 30. A check-up of a built-in nonvolatile memory 11 in the microcomputer 10 is conducted by connecting the external communication device 20 to both the microcomputer 10 and control computer 30 so as to allow mutual communications.

The microcomputer 10 comprises the nonvolatile memory 11, a RAM (Random Access Memory) 12, a CPU (Central Processing Unit) 13, a communication circuit 14, a control circuit 15, and a boot ROM (Read Only Memory) 16, which are interconnected to each other via an internal bus. The microcomputer 10 further comprises a terminal group 17 including a VPP terminal 17a, a VCC terminal 17b, a GND terminal 17c, a RST terminal 17d, a CLK terminal 17e, and an I/O (Input/Output) terminal 17f.

The CPU 13 runs a program stored in the boot ROM 16 and RAM 12. The communication circuit 14 and control circuit 15 mainly control communications with the external communication device 20 as to a flowing rate, protocols, etc.

The boot ROM 16 positions (stores) only a program to operate the communication circuit 14 in such a manner so as to be run by the CPU 13. More specifically, the boot ROM 16 stores a program for the following jobs of:

receiving the test program for the nonvolatile memory 11 from the external communication device 20 and storing the same in the RAM 12 at a test command issued from the external communication device 20;

running the test program; and sending a test result to the external communication device 20.

The test program for the nonvolatile memory 11 is transferred to the RAM 12 from the external communication device 20, stored in the RAM 12 and run by the CPU 13 in order to conduct a check-up of the nonvolatile memory 11.

The external communication device 20 comprises a communication microcomputer 21, a communication control circuit 22, a power source circuit 23, and a storage device 25, which are interconnected to each other via an internal bus. The external communication device 20 further comprises a terminal group 24 including a VPP terminal 24a, a VCC terminal 24b, a GND terminal 24c, a RST terminal 24d, a CLK terminal 24e, and an I/O terminal 24f.

The external communication device 20 and microcomputer 10 are connected to each other through the terminal group 17 and terminal group 24 in such a manner that the terminals in each group are connected to each other in a one-to-one correspondence. Power is supplied respectively from the VPP terminal 24a to the VPP terminal 17a and from the VCC terminal 24b to the VCC terminal 17b, and a clock is supplied from the CLK terminal 24e to the CLK terminal 17e. In addition, data communication is allowed between the I/O terminals 17f and 24f when necessary.

The communication microcomputer 21 and communication control circuit 22 mainly control communications with the microcomputer 10 and control computer 30 as to a communication rate, protocols, etc.

The power source circuit 23 is a power source which supplies a driving power to the external communication device 20 and the microcomputer 10 connected thereto through the VPP terminals 24a and 17a and VCC terminals 24b and 17b. In other words, the power necessary for the microcomputer 10 during the check-up of the nonvolatile memory 11 is supplied from the power source circuit 23 in the external communication device 20. Thus, when the test of the nonvolatile memory 11 is completed and the communication between the microcomputer 10 and external communication device 20 is cut, a power source voltage currently supplied from the power source circuit 23 in the external communication device 20 is stopped, whereupon the test program stored in the RAM 12 is erased automatically.

The storage device 25 is a memory which stores the test program for the built-in nonvolatile memory 11 in the microcomputer 10. In order to conduct the check-up of the nonvolatile memory 11, the test program is read out from the storage device 25 and sent to the microcomputer 10. The test program may be sent to the external communication device 20 from the control computer 30 and stored temporarily in the storage device 25 each time a check-up of the nonvolatile memory 11 is conducted.

Further, the external communication device 20 is controlled by an external device, namely, the control computer 30. Alternatively, the external communication device 20 may be controlled directly by the communication microcomputer 21. Further, a plurality of external communication devices 20 may be connected to one control computer 30, so that a plurality of microcomputers 10 can be tested simultaneously.

Next, the following will explain an IC (Integrated Circuit) card 1 packing the above microcomputer 10 with reference to FIG. 2.

The IC card 1 is furnished with, on its surface, a terminal group 17' connected to the terminal group 17 in the microcomputer 10 in such a manner that the terminals in each group are connected to each other in a one-to-one correspondence. Thus, the external communication device 20 is connected to the terminal group 17 through connection between the terminals in the terminal group 24 and terminal group 17' in a one-to-one correspondence, whereby a communication with the microcomputer 10 is allowed.

Thus, as was with the microcomputer 10, a plurality of the external communication devices 20 may be connected to one control computer 30, so that a plurality of IC cards 1 can be tested simultaneously.

Next, the following will explain the operations involved in the test on the microcomputer 10 with reference to the flowchart of FIG. 3. It should be appreciated that the operations involved in the test on the IC card 1 (FIG. 2) are the same.

Initially, the microcomputer 10 is electrically connected to the external communication device 20 through the terminal groups 17 and 24 (terminal groups 17' and 24). The electrical connection may be established by means of direct physical contact or electric waves, such as electromagnetic waves, as long as communications are allowed.

When the connection between the microcomputer 10 and external communication device 20 is established, the control microcomputer 30 sends a command to the external communication device 20 to start the transfer of the test program for the nonvolatile memory 11 to the microcomputer 10 (S1 and S2).

Then, the external communication device 20 sends a signal (command) to the I/O terminal 17f of the microcomputer 10 to start the transfer of the test program (S3). Upon receipt of the signal (test program transfer start command) (S4), the microcomputer 10 sets the conditions necessary for the transfer, such as area allocation in the RAM 12 for the transferred test program, whereby the microcomputer 10 becomes ready to receive data (test program).

When the state of the microcomputer 10 to have become ready to receive data is confirmed, the test program is sent to the microcomputer 10 from the external communication device 20 through the I/O terminals 24f and 17f, and the microcomputer 10 stores the received test program in the RAM 12 (S5 and S6).

The series of operations thus far are carried out by the CPU 13 as it runs the prestored program in the boot ROM 16 in the microcomputer 10. When the transfer of the test program to the RAM 12 is completed, the CPU 13 confirms the completion of the transfer of the test program and switches the control onto a specific address in the RAM area, and starts to run the test program on the RAM 12 (S7). More specifically, the CPU 13 sets the nonvolatile memory 11 to the test mode, completes the check-up items one by one, and creates test result data including the test result, a fail log, etc.

Upon conformation of the completion of the memory test (S8), the CPU 13 sends the result data of the memory test to the external communication device 20 which has been waiting for the same (S9, S10, S11). The external communication device 20 makes the pass/fail judgment of the nonvolatile memory 11 based on the result data of the memory test sent from the microcomputer 10, and sends the judging result of the memory test to the control computer 30 which has been waiting for the same (S12, S13, S14). Finally, the test on the nonvolatile memory 11 is completed when the control microcomputer 30 receives the pass/fail judgement from the microcomputer 10 (S14).

It should be appreciated that it does not make any difference whether the microcomputer 10 makes the pass/fail judgment by the self based on the test result data which had been created by the self or the control computer 30 does so based on the received test result data.

When the test is completed and the communication between the microcomputer 10 and external communication device 20 is cut, a power source voltage currently supplied to the microcomputer 10 from the power source circuit 23 in the external communication device 20 through the VPP terminals 24a and 17a and VCC terminals 24b and 17b is stopped, whereupon the test program stored in the RAM 12 is erased automatically.

As has been discussed, the microcomputer having a built-in nonvolatile memory of the present embodiment comprises:

the communication circuit for transferring the test program from the external communication device in the check system to the RAM;

the boot ROM enabling the CPU to transfer the test program; and the CPU for switching the nonvolatile memory to the test mode in accordance with the test program on the RAM.

According to the above arrangement, the nonvolatile memory is switched to the test mode on the RAM, and consequently, highly reliable and secure test can be conducted on the built-in nonvolatile memory in the microcomputer. In other words, by transferring the test program from the external to the RAM and conducting a plurality kinds of tests on the RAM, a plurality kinds of tests can be conducted by temporarily transferring the same on the RAM without using a conventionally essential exclusive-use ROM having stored the test program. Consequently, a highly reliable test, such as a margin test for the memory cell, can be conducted on the nonvolatile memory.

In addition, the test program transferred onto the RAM is erased as soon as the test is completed and the supply of the power source voltage is stopped. Thus, because the test program is not left in the completed product, unauthorized analysis of the test program can be prevented. This is particularly effective for a product that requires high reliability and security, such as the IC card packing the foregoing microcomputer having a nonvolatile memory.

Embodiment 2

Figure 4:
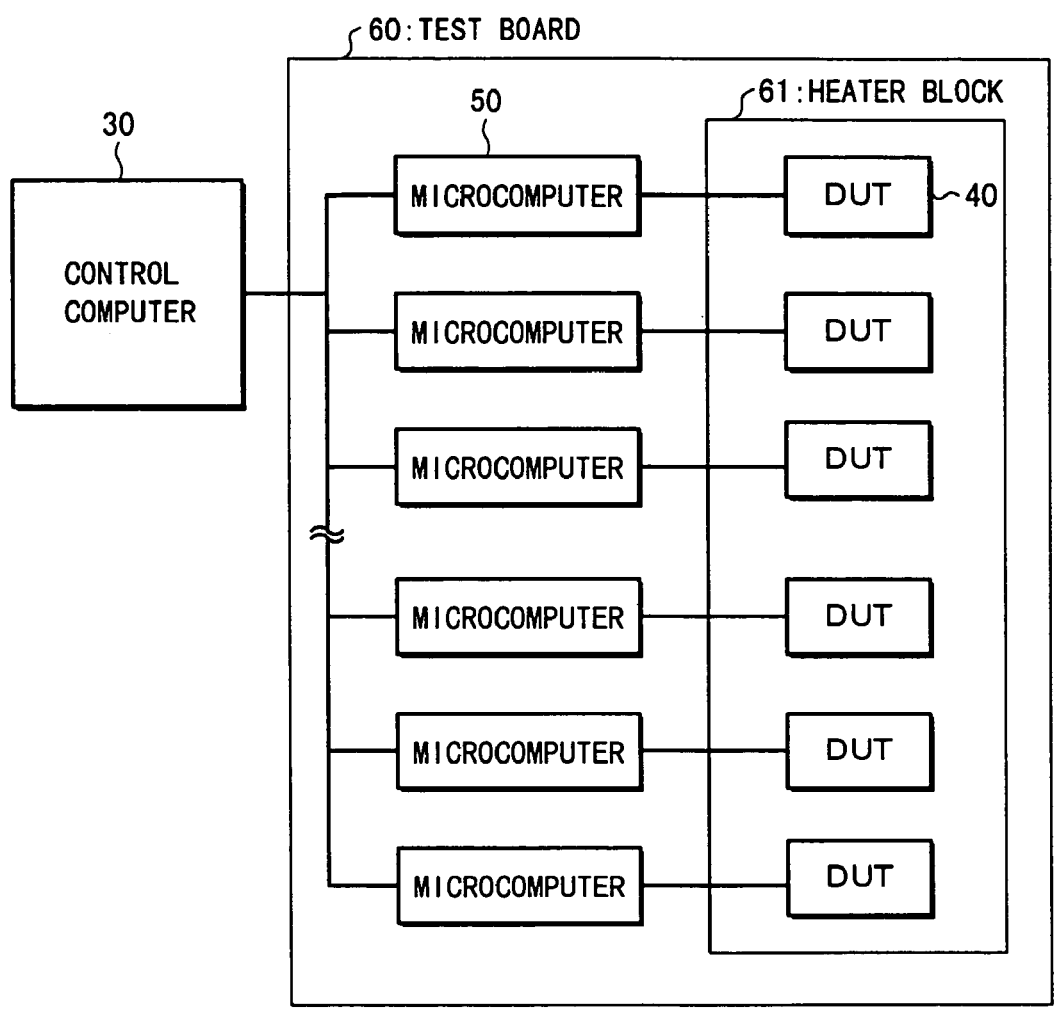
FIG. 4 is a block diagram schematically showing an arrangement of a check system of a DUT having a built-in nonvolatile memory in accordance with another embodiment of the present invention.
Figure 6:
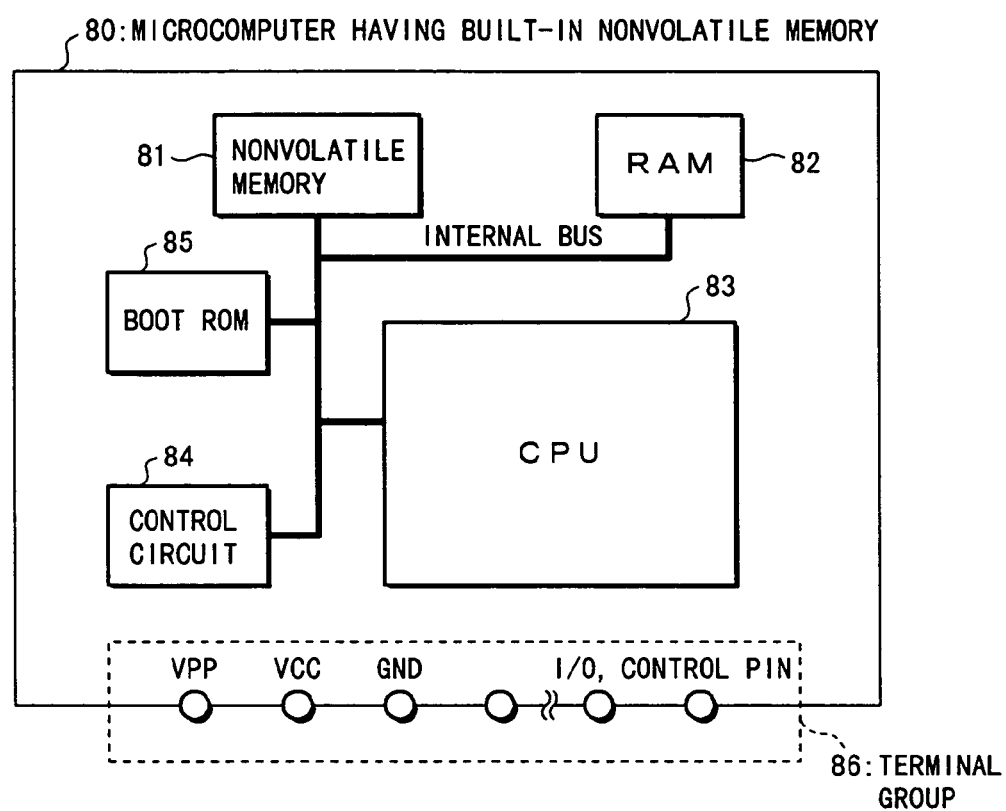
FIG. 6 is a block diagram schematically showing an arrangement of a conventional microcomputer having a built-in nonvolatile memory.
Figure 7:
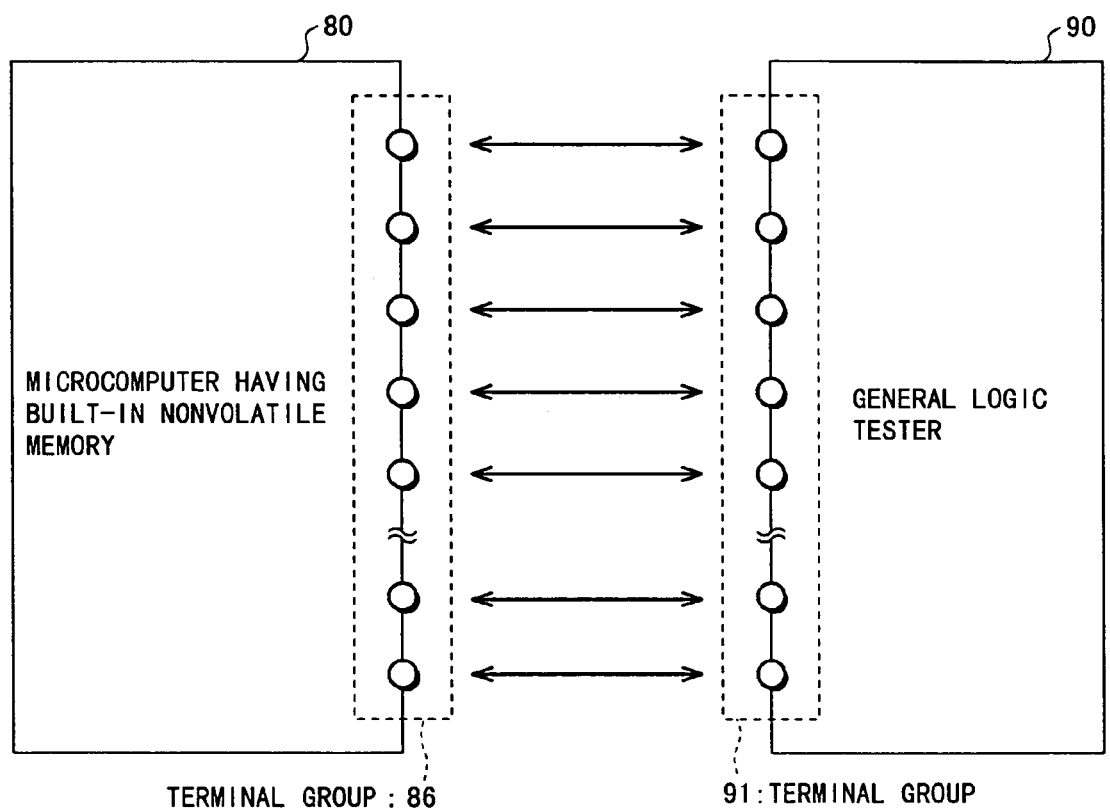
FIG. 7 is a block diagram schematically showing an arrangement of a check system of the conventional microcomputer having a built-in nonvolatile memory of FIG. 6.

Referring to FIGS. 4 and 5, the following description will describe another embodiment of the present invention. Hereinafter, like components are labeled with like reference numerals with respect to Embodiment 1, and the description of these components is not repeated for ease of explanation.

As shown in FIG. 4, a check system of a microcomputer 40 having a built-in nonvolatile memory (hereinafter, referred to simply as DUT (Device Under Test) 40) comprises a communication control microcomputer 50 (hereinafter referred to simply as microcomputer 50) and a control computer 30. A check-up of the built-in nonvolatile memory 11 in the DUT 40 is conducted when paris of the DUTs 40 and microcomputers 50 are provided on a test board 60 in such a manner that (1) the DUT 40 and microcomputer 50 in each pair are connected to each other so as to allow mutual communications, and (2) all the DUTs 40 are connected to one control computer 30 so as to allow mutual communications.

The DUT 40 and microcomputer 50 of the present embodiment are of the same structures as those of the microcomputer 10 and external communication device 20 of Embodiment 1, respectively.

In the present check system, a plurality of microcomputers 50 and DUTs 40 are connected in such a manner so as to allow mutual communications in a one-to-one correspondence in each pair, and aligned in parallel on the test board 60. Each microcomputer 50 is connected to the computer 30 in such a manner so as to allow mutual communications individually.

Further, as shown in FIG. 4, the check system is arranged in such a manner that it can additionally conduct a burn-in test by providing the DUTs 40 in a heater block 61. It does not cause any problem if the heat block 61 is realized by connecting the DUTs 40 and microcomputers 50 to each other through cables and placing the DUTs 40 in a hot temperature bath.

FIG. 5 is a view explaining the check system which checks IC card modules 41 instead of the DUTs 40 of FIG. 4. Each IC card module 41 is of the same structure as that of the IC card 1 of Embodiment 1.

The check system is arranged in such a manner that it can additionally conduct a burn-in test by providing the IC card modules 41 in the heater block 61. It does not cause any problem if the heat block 61 is realized by connecting the IC card modules 41 and microcomputers 50 to each other through cables and placing the IC card modules 41 in a hot temperature bath.

Next, the following will explain the operations involved for the test on the DUT 40 with reference to the flowchart of FIG. 3. It should be appreciated that the operations involved for the test on the IC card module 41 (FIG. 5) are the same.

The control computer 30 sends a test command to all the microcomputers 50 connected thereto simultaneously to start the transfer of the test program for the nonvolatile memory 11 to the DUTs 40 (S1). Upon receipt of the test command, each microcomputer 50 processes the command, and confirms that the received command is the test command (S2).

Upon conformation of the test command, each microcomputer 50 sends a signal (command) to the corresponding DUT 40 to start the transfer of the necessary test program (S3). Upon receipt of the signal (test program transfer start command) (S4), the DUT 40 sets the necessary conditions, such as area allocation for the transferred test program on the RAM 12, whereby it becomes ready to receive data (test program).

When the state of the DUT 40 that it has become ready to receive the data is confirmed, each microcomputer 50 starts to send the test program, and the DUT 40 stores the received test program in the RAM 12 (S5, S6). It does not make any difference whether the test program is sent from the control computer 30 or the memory (equivalent to the storage device 25) in each microcomputer 50.

The series of operations thus far are carried out by the CPU 13 as it runs the program prestored in the boot ROM 16 in the DUT 40. When the transfer of the test program to the RAM 12 is completed, the CPU 13 in each DUT 40 confirms the completion of the transfer of the test program, and switches the control to a specific address in the RAM area, whereupon the CPU 13 starts to run the test program on the RAM 12 (S7). More specifically, the CPU 13 sets the nonvolatile memory to the test mode, carries out the check-up items one by one, and creates the test result data including the test result, a fail log, etc.

Upon confirming the completion of the memory test (S8), the CPU 13 sends the result data of the memory test to the microcomputer 50 which has been waiting for the same (S9, S10, S11). Each microcomputer 50 makes the pass/fail judgment of the nonvolatile memory 11 based on the result data of the memory test received from the corresponding DUT 40, and sends the judging result of the memory test to the control computer 30 which has been waiting for the same (S12, S13, S14). Finally, when all the DUTs 40 receive the pass/fail judgement, the control computer 30 completes the test on the nonvolatile memory 11 (S14).

It should be appreciated that it does not make any difference whether the DUT 40 makes the pass/fail judgment by the self based on the test result data which had been created by the self or the microcomputer 50 or control computer 30 does so based on the received test result data.

When the test is completed and the communication between the DUT 40 and microcomputer 50 in each pair is cut, the test program transferred onto the RAM 12 is erased automatically.

As has been discussed, in the check system of the present embodiment of the microcomputer having a nonvolatile memory, a plurality of the microcomputers equivalent to the external communication device of Embodiment 1 are aligned in parallel on the same test board, and all the microcomputers are connected to one system control computer.

In other words, in the check system of the IC card packing the microcomputer having a built-in nonvolatile memory, a microcomputer different from the external communication device in the check system of Embodiment 1 is used as the external communication device, a plurality of external communication devices are aligned on the same board, and all the external communication devices are controlled intensively by connecting the same to another communication device (control computer). Consequently, the check system is arranged in such a manner that a plurality of microcomputers each having a built-in nonvolatile memory and a plurality of IC cards packing the same are tested simultaneously.

According to the above arrangement, the DUTs and microcomputers aligned on the same test board are controlled intensively, thereby making it possible to test a plurality of chips simultaneously. Consequently, the cost of the test can be saved markedly.

It should be appreciated that the foregoing descriptions in each embodiment are not provided to limit the scope of the present invention, and the present invention can be modified in diversified manners as described below, for example.

The microcomputer having a built-in nonvolatile memory in each of Embodiments 1 and 2 is a microcomputer having an at least partially erasable built-in nonvolatile memory, which may be arranged in such a manner that, when a nonvolatile memory section is tested:

a control program prestored in the boot ROM is run by entering a test command from an external communication device;

a test program is transferred from the external communication device to a built-in RAM through a communication circuit;

a control of a CPU is switched to the built-in RAM after the test program has been transferred and a test is conducted on the nonvolatile memory section; and a test result and a fail log are transferred to the external communication device through the communication circuit again.

According to the above arrangement, a highly reliable and secure test can be conducted at a low cost without using a general tester.

The check system of the microcomputer having a nonvolatile memory in each of Embodiments 1 and 2 may be arranged in such a manner that, when a nonvolatile memory section of the above-arranged microcomputer having a nonvolatile memory is tested:

a control program prestored in a boot ROM is run by entering a test command from an external communication device;

a test program is transferred from the external communication device to a built-in RAM through the communication circuit;

a control of a CPU is switched to the built-in RAM after the test program has been transferred and a test is conducted on the nonvolatile memory section; and a test result and a fail log are transferred to the external communication device through the communication circuit again.

According to the above arrangement, a highly reliable and secure test can be conducted at a low cost without using a general tester.

A check system of the microcomputer having a nonvolatile memory in each of Embodiments 1 and 2 may be arranged in such a manner that, when a nonvolatile memory section of the above-arranged microcomputer having a nonvolatile memory is tested:

a plurality of external communication devices are aligned on the same board by exploiting the above check system and using another microcomputer different from the external communication device;

external communication devices are connected to their respective communication devices, respectively; and all the external communication devices are controlled intensively.

According to the above arrangement, a plurality of microcomputers each having a built-in nonvolatile memory can be tested simultaneously.

The microcomputer having a built-in nonvolatile memory in each of Embodiments 1 and 2 may be packed in an IC card.

A check system of the microcomputer having a nonvolatile memory in each of Embodiments 1 and 2 may be arranged in such a manner that, when a nonvolatile memory section in the above-arranged IC card is tested:

a control program prestored in a boot ROM is run by entering a test command from an external communication device;

a test program is transferred from the external communication device to a built-in RAM through a communication circuit;

a control of a CPU is switched to the built-in RAM after the test program has been transferred and a test is conducted on the nonvolatile memory section; and a test result and a fail log are transferred to the external communication device through the communication circuit again.

According to the above arrangement, a highly reliable and secure test can be conducted at a low cost without using a general tester.

A check system of the microcomputer having a nonvolatile memory in each of Embodiments 1 and 2 may be arranged in such a manner that, when a nonvolatile memory section of the microcomputer having a nonvolatile memory packed in the above-arranged IC card is tested:

a plurality of external communication devices are aligned on the same board by exploiting the above check system and using another microcomputer;

the external communication devices are connected to the communication devices, respectively; and all the external communication devices are controlled intensively.

According to the above arrangement, a plurality of the IC cards each packing the microcomputer having a built-in nonvolatile memory can be tested simultaneously.

As has been discussed, a microcomputer having a built-in nonvolatile memory of the present invention may comprise:

a nonvolatile memory;

a boot ROM;

a RAM;

a CPU for running a program stored in the boot ROM and RAM; and a communication circuit for controlling a communication with a check system, wherein the boot ROM has stored a control program for following jobs of:

receiving a test program for the nonvolatile memory from the check system and store the same in the RAM at a test command issued from the check system, running the test program, and sending the test result to the check system.

A check system of the present invention of a microcomputer having a built-in nonvolatile memory may include an external communication device including:

a storage device having stored a test program for a built-in nonvolatile memory in the microcomputer;

a communication control circuit for controlling a communication with the microcomputer having a built-in nonvolatile memory; and a communication microcomputer for, when a check-up of the nonvolatile memory is conducted, sending the test program to the microcomputer having a built-in nonvolatile memory.

According to the above arrangement, when the nonvolatile memory is checked, the microcomputer having a built-in nonvolatile memory receives the test program for the nonvolatile memory from the check system and stores the same in the RAM in accordance with the control program prestored in the boot ROM at a test command issued from the check system, and runs the test program, after which the microcomputer having a built-in nonvolatile memory sends the test result to the check system.

On the other hand, the check system sends the test command from the external communication device to the microcomputer having a nonvolatile memory together with the test program stored in the storage device.

Accordingly, the test program is run after the nonvolatile memory is switched to the test mode by the test program on the RAM, whereby a highly reliable and secure test can be conducted. In other words, by transferring the test program from the external communication device to the RAM and conducting the test on the RAM, a plurality kinds of tests can be conducted by temporarily transferring the same on the RAM without using a conventionally essential exclusive-use ROM having stored the test program. Consequently, a highly reliable test, such as a margin test for the memory cell, can be conducted on the nonvolatile memory.

Also, the test program transferred to the RAM is erased as soon as the test is completed and the supply of the power source voltage is stopped. Thus, because the test program is not left in the completed product, unauthorized analysis of the test program can be prevented. This is particularly effective for a product that requires high reliability and security, such as the IC card packing the microcomputer having a nonvolatile memory.

As has been discussed, the microcomputer having a built-in nonvolatile memory and the check system thereof can conduct a highly reliable and secure test at a low cost without using the general tester and leaving the test program on the chip.

If the test as accurate as above is conducted, the number of the check-up items is increased markedly. However, the check system is arranged in such a manner that a plurality of external communication devices are controlled intensively by the control computer. Thus, because a plurality of microcomputers each having a built-in nonvolatile memory can be tested simultaneously, the cost of the test can be saved significantly as an effect.

In other words, the check system of the present invention of the microcomputer having a built-in nonvolatile memory may comprise:

a control computer, connected to a plurality of external communication devices, for intensively controlling microcomputers each having a built-in nonvolatile memory and connected to the plurality of the external communication devices, respectively.

According to the above arrangement, the built-in nonvolatile memories in a plurality of microcomputers are controlled intensively by the control computer, thereby making it possible to check a plurality of chips simultaneously. Thus, the costs of the check-up of the nonvolatile memory can be saved significantly.

The foregoing effects are especially important for the IC cards each packing the microcomputer having a built-in nonvolatile memory of a large capacity for storing various kinds of information.

An IC card of the present invention may be arranged to pack the above microcomputer having a built-in nonvolatile memory.

In addition, a check system of the IC card packing the microcomputer having a built-in nonvolatile memory may comprise an external communication device including:

a storage device having stored a test program for the built-in nonvolatile memory in the microcomputer packed in the IC card;

a communication control circuit for controlling a communication with the IC card; and a communication microcomputer for sending the test program to the IC card when conducting a test on the nonvolatile memory.

According to the above arrangement, in order to conduct a check-up of the nonvolatile memory, the microcomputer having a built-in nonvolatile memory packed in the IC card receives the test program for the nonvolatile memory from the check system and stores the same in the RAM at a test command issued from the check system in accordance with the control program prestored in the boot ROM, and runs the test program, after which the microcomputer having a built-in nonvolatile memory sends the test result to the check system.

On the other hand, the check system sends the test command to the microcomputer having a built-in nonvolatile memory packed in the IC card from the external communication device together with the test program stored in the storage device.

Accordingly, a highly reliable and secure test can be conducted by switching the nonvolatile memory to the test mode by the test program on the RAM. In other words, by transferring the test program from the external communication device to the RAM and conducting the test on the RAM, a plurality kinds of tests can be conducted by temporarily transferring the same on the RAM without using a conventionally essential exclusive-use ROM having stored the test program. Consequently, a highly reliable test, such as a margin test for the memory cell, can be conducted on the nonvolatile memory.

Also, the test program transferred to the RAM is erased as soon as the test is completed and the supply of the power source voltage is stopped. Thus, because the test program is not left in the completed product, unauthorized analysis of the test program can be prevented. This is particularly effective for a product that requires high reliability and security, such as the IC card packing the microcomputer having a nonvolatile memory.

As has been discussed, the IC card packing the microcomputer having a nonvolatile memory and the check system thereof can conduct a highly reliable and secure test at a low cost without using the general tester and leaving the test program on the chip.

The check system of the present invention of the IC card packing a microcomputer having a built-in nonvolatile memory may be arranged in such a manner so as to include a control computer, connected to a plurality of external communication devices, for intensively controlling a check-up of the IC cards connected to the plurality of the external communication devices, respectively.

According to the above arrangement, the built-in nonvolatile memories in a plurality of microcomputers packed in the IC cards are controlled intensively by using the control computer, thereby making it possible to check a plurality of the IC cards simultaneously. Thus, the cost of the check-up of the nonvolatile memory packed in the IC card can be saved significantly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A microcomputer having an at least partially erasable built-in nonvolatile memory including:

a communication circuit for receiving a test program for said nonvolatile memory from an external check system;

a RAM on which said test program is run; and a boot ROM comprising a control program for, upon receiving a test command issued by the external check system, enabling said receiving of said test program from said external check system using said communication circuit and running of said test program on said RAM, wherein said boot ROM is detached from said nonvolatile memory.

2. The microcomputer of claim 1, further comprising a plurality of microcomputers each having a built-in nonvolatile memory, and wherein said check system comprises a control computer connected to a plurality of external communication devices, for intensively controlling a check-up of said plurality of microcomputers each connected to said plurality of external communication devices, respectively, and each of said plurality of microcomputers including a boot ROM comprising a control program for, upon receiving a test command issued by the control computer, enabling receiving of said test program from said control computer through a communication circuit and running of said test program on said RAM.

3. The microcomputer of claim 1, wherein enabling said receiving of said test program performed by the control program of said boot ROM comprises allocating an area on said RAM sufficient to receive the test program and controlling said communication circuit to receive and transmit the test program to said RAM.

4. A microcomputer having an at least partially erasable built-in nonvolatile memory including:

a nonvolatile memory;

a boot ROM, wherein said boot ROM is detached from said nonvolatile memory;

a RAM;

a CPU for running a program stored in said boot ROM and RAM; and a communication circuit for controlling a communication with a check system, said boot ROM having stored a control program for jobs of:

upon receiving a test command issued from said check system, receiving a test program for said nonvolatile memory from said check system to be stored in said RAM;

running said test program; and sending a test result to said check system.

5. The microcomputer of claim 4, further comprising a plurality of microcomputers having a built-in nonvolatile memory, and wherein said check system comprises a control computer connected to a plurality of external communication devices, for intensively controlling a check-up of said plurality of said microcomputers each connected to said plurality of external communication devices, respectively, and each of said plurality of microcomputers including a boot ROM having stored a control program for jobs including upon receiving a test command issued from said control computer, receiving said test program for said nonvolatile memory from said check system to be stored in said RAM.

6. The microcomputer of claim 4, wherein said receiving of said test program performed by the control program stored in said boot ROM comprises allocating an area on said RAM sufficient to receive the test program and controlling said communication circuit to receive and transmit the test program to said RAM.

7. A check system of an at least partially erasable built-in nonvolatile memory in a microcomputer furnished with:

at least one external communication device connected to said microcomputer in such a manner so as to allow a communication in a one-to-one correspondence, each external communication device including, a storage device having stored a test program for said built-in nonvolatile memory in said microcomputer, and a communication microcomputer for sending said test program to said microcomputer, wherein said microcomputer includes a boot ROM comprising a control program for, upon receiving a test command issued by the corresponding external communication device, enabling receiving of said test program from said corresponding external communication device using a communication circuit and running of the test program on a RAM, and wherein said boot ROM is detached from said nonvolatile memory.

8. The check system of claim 7, further furnished with a control computer, connected to a plurality of external communication devices, for intensively controlling a check-up of a plurality of microcomputers each having a built-in nonvolatile memory and connected to said plurality of external communication devices, respectively.

9. The check system of claim 8, wherein each of said plurality of microcomputers including a boot ROM comprising a control program for, upon receiving a test command issued by said control computer, enabling receiving of said test program from said control computer through a communication circuit and running of said test program on said RAM.

10. The check system of claim 7, wherein enabling said receiving of said test program performed by the control program of said boot ROM comprises allocating an area on said RAM sufficient to receive the test program and controlling said communication circuit to receive and transmit the test program to said RAM.

11. A check system of an at least partially erasable built-in nonvolatile memory in a microcomputer furnished with an external communication device including:

a storage device having stored a test program for said microcomputer having said built-in nonvolatile memory;

a communication control circuit for controlling a communication with said microcomputer; and a communication microcomputer for sending said test program to said microcomputer when checking the built-in nonvolatile memory therein, wherein said microcomputer includes a boot ROM comprising a control program for, upon receiving a test command issued by the external communication device, enabling receiving of said test program from said external communication device using a communication circuit and running of the test program on a RAM, and wherein said boot ROM is detached from said nonvolatile memory.

12. The check system of claim 11, further furnished with a control computer, connected to a plurality of external communication devices, for intensively controlling a check-up of a plurality of microcomputers each having a built-in nonvolatile memory and connected to said plurality of external communication devices, respectively.

13. The check system of claim 12, wherein each of said plurality of microcomputers including a boot ROM comprising a control program for, upon receiving a test command issued by said control computer, enabling receiving of said test program from said control computer through a communication circuit and running of said test program on said RAM.

14. The check system of claim 11, wherein enabling said receiving of said test program performed by the control program of said boot ROM comprises allocating an area on said RAM sufficient to receive the test program and controlling said communication circuit to receive and transmit the test program to said RAM.

15. An IC card packing a microcomputer having an at least partially erasable built-in nonvolatile memory including:

a communication circuit for receiving a test program for a nonvolatile memory from an external check system;

a RAM on which said test program is run, and a boot ROM comprising a control program for, upon receiving a test command issued by the external check system, enabling said receiving of said test program from said external check system using said communication circuit and running of said test program on said RAM, wherein said boot ROM is detached from said nonvolatile memory.

16. An IC card packing a microcomputer having an at least partially erasable built-in nonvolatile memory including:

said at least partially erasable nonvolatile memory;

a boot ROM, wherein said boot ROM is detached from said nonvolatile memory;

a RAM;

a CPU for running a program stored in said boot ROM and RAM; and a communication circuit for controlling a communication with a check system, said boot ROM having stored a control program for jobs of:

upon receiving a test command issued from said check system, receiving a test program for said nonvolatile memory from said check system to be stored in said RAM;

running said test program; and sending a test result to said check system.

17. A check system of an IC card packing a microcomputer having an at least partially erasable built-in nonvolatile memory furnished with:

at least one external communication device connected to said microcomputer packed in said IC card in such a manner so as to allow a communication in a one-to-one correspondence, each external communication device including, a storage device having stored a test program for said built-in nonvolatile memory in said microcomputer, and a communication microcomputer for sending said test program to said IC card, wherein said microcomputer includes a boot ROM comprising a control program for, upon receiving a test command issued by the corresponding external communication device, enabling receiving of said test program from said corresponding external communication device using a communication circuit and running of the test program on a RAM, and wherein said boot ROM is detached from said nonvolatile memory.

18. The check system of claim 17, further furnished with a control computer, connected to a plurality of external communication devices, for intensively controlling a check-up of a plurality of IC cards connected to said plurality of external communication devices, respectively.

19. A check system of an IC card packing a microcomputer having an at least partially erasable built-in nonvolatile memory furnished with an external communication device including:

a storage device having stored a test program for said built-in nonvolatile memory in said microcomputer packed in said IC card;

a communication control circuit for controlling a communication with said IC card; and a communication microcomputer for sending said test program to said IC card when checking said built-in nonvolatile memory, wherein said microcomputer includes a boot ROM comprising a control program for, upon receiving a test command issued by the external communication device, enabling receiving of said test program from said external communication device using a communication circuit and running of the test program on a RAM, and wherein said boot ROM is detached from said nonvolatile memory.

20. The check system of claim 19, further furnished with a control computer, connected to a plurality of external communication devices, for intensively controlling a check-up of a plurality of IC cards connected to said plurality of external communication devices, respectively.

* * * * *